United States Patent
Asakawa et al.

(10) Patent No.: US 12,422,242 B2
(45) Date of Patent: Sep. 23, 2025

(54) STRAIN GAUGE

(71) Applicant: MINEBEA MITSUMI Inc., Nagano (JP)

(72) Inventors: Toshiaki Asakawa, Nagano (JP); Masaki Kitazono, Tokyo (JP); Eiji Misaizu, Nagano (JP)

(73) Assignee: MINEBEA MITSUMI Inc., Nagano (JP)

( * ) Notice: Subject to any disclaimer, the term of this patent is extended or adjusted under 35 U.S.C. 154(b) by 407 days.

(21) Appl. No.: 17/758,721

(22) PCT Filed: Jan. 13, 2021

(86) PCT No.: PCT/JP2021/000862
§ 371 (c)(1),
(2) Date: Jul. 13, 2022

(87) PCT Pub. No.: WO2021/145342
PCT Pub. Date: Jul. 22, 2021

(65) Prior Publication Data
US 2023/0030190 A1     Feb. 2, 2023

(30) Foreign Application Priority Data
Jan. 15, 2020 (JP) .................. 2020-004564

(51) Int. Cl.
G01B 7/16     (2006.01)
G01L 1/22     (2006.01)
H05K 1/02     (2006.01)

(52) U.S. Cl.
CPC .............. G01B 7/20 (2013.01); G01L 1/2287 (2013.01); H05K 1/028 (2013.01); *H05K 2201/10151* (2013.01)

(58) Field of Classification Search
CPC ........ G01B 7/20; G01L 1/2287; H05K 1/028; H05K 2201/10151
See application file for complete search history.

(56) References Cited

U.S. PATENT DOCUMENTS 4,134,096 A * 1/1979 Denes .................... H01C 17/23
                                                          338/195
4,160,897 A   7/1979 Makino
(Continued)

FOREIGN PATENT DOCUMENTS

EP      0271993       6/1988
JP      S53-095622    8/1978
(Continued)

OTHER PUBLICATIONS

International Search Report for PCT/JP2021/000862 mailed on Mar. 16, 2021.
(Continued)

*Primary Examiner* — Kyung S Lee
(74) *Attorney, Agent, or Firm* — IPUSA, PLLC (57) ABSTRACT

A strain gauge includes: a flexible substrate; a resistor formed on one side of the substrate; a pair of terminal parts electrically connected to both ends of the resistor; and a plurality of resistance value tuning wires configured to tune the resistance value between the pair of terminal parts. In this strain gauge, the plan shape of the resistor is a spiral (Continued)

shape formed by two linear resistance wires about the halfway part of the two linear resistance wires, the two linear resistance wires being a predetermined space apart from each other and extending in the same direction from the halfway part, and the resistance value tuning wires are arranged discretely so as to bridge between the two linear resistance wires.

8 Claims, 6 Drawing Sheets

(56) References Cited

U.S. PATENT DOCUMENTS

| | | | | |
|---|---|---|---|---|
| 4,359,277 | A | | 11/1982 | Shimizu et al. |
| 5,057,964 | A | * | 10/1991 | Bender ................ H01C 7/003 338/195 |
| 5,065,221 | A | * | 11/1991 | Imamura ............. H01C 17/23 338/195 |
| 5,394,019 | A | * | 2/1995 | Audy .................. H01C 17/24 338/195 |
| 6,532,824 | B1 | * | 3/2003 | Ueno ................... G01P 15/125 73/780 |
| 9,612,170 | B2 | | 4/2017 | Vosgueritchian et al. |
| 10,133,418 | B2 | * | 11/2018 | Smith ................. G06F 3/04164 |
| 10,653,013 | B1 | * | 5/2020 | Hwang .................. H01C 1/14 |
| 2014/0238153 | A1 | | 8/2014 | Wood et al. |
| 2015/0338294 | A1 | * | 11/2015 | Watson ................ H01C 17/23 73/774 |
| 2017/0023420 | A1 | | 1/2017 | Vosgueritchian et al. |
| 2020/0325571 | A1 | | 10/2020 | Asakawa et al. |

FOREIGN PATENT DOCUMENTS

| | | |
|---|---|---|
| JP | S54-005239 | 1/1979 |
| JP | S54-106856 U | 7/1979 |
| JP | S63-171118 | 7/1988 |
| JP | 2015-031633 | 2/2015 |
| JP | 2016-161539 | 9/2016 |
| JP | 2017-130671 | 7/2017 |
| JP | 2017-167151 | 9/2017 |
| JP | 2018-529934 | 10/2018 |
| JP | 2019-066311 | 4/2019 |
| JP | 2019-132791 | 8/2019 |

OTHER PUBLICATIONS

Office Action mailed on Apr. 2, 2024 with respect to the corresponding Japanese patent application No. 2020-004564.

Osamu Watanabe, "Strain Gauges and Their Applications", pp. 118-121, published by Nikkan Kogyo Shimbun, Ltd. (May 30, 1971) (With Partial Translation).

Office Action mailed on Jan. 20, 2025 with respect to the corresponding Chinese application No. 202180009134.8.

* cited by examiner

STRAIN GAUGE

TECHNICAL FIELD

The present disclosure relates to a strain gauge.

BACKGROUND ART

There is known a strain gauge that is attached to a measurement object and detects the strain of the measurement object. The strain gauge includes a resistor for detecting strain. For the material of the resistor, for example, Cr (chromium), Ni (nickel) or other such materials are used. Furthermore, the resistor is formed, for example, on a substrate consisting an insulating resin. There is also a strain gauge with a resistor patterned in a spiral shape (see, for example, Patent Document 1).

CITATION LIST

Patent Document

[Patent Document 1] U.S. Pat. No. 9,612,170

SUMMARY

However, the strain gauge with a resistor patterned in a spiral shape has difficulty fine-tuning the resistance value.

The present disclosure has been made in view of the foregoing, and is intended to provide a strain gauge having a spiral resistor and being capable of fine-tuning the resistance value.

A strain gauge, according to an embodiment of the present disclosure, includes: a flexible substrate; a resistor formed on one side of the substrate; a pair of terminal parts electrically connected to both ends of the resistor; and a plurality of resistance value tuning wires configured to tune the resistance value between the pair of terminal parts. In this strain gauge, the plan shape of the resistor is a spiral shape formed by two linear resistance wires about the halfway part of the two linear resistance wires, the two linear resistance wires being a predetermined space apart from each other and extending in the same direction from the halfway part, and the resistance value tuning wires are arranged discretely so as to bridge between the two linear resistance wires.

Effects of the Invention

According to the art of the present disclosure, it is possible to provide a strain gauge having a spiral resistor and being capable of fine-tuning the resistance value.

DESCRIPTION OF EMBODIMENTS

An embodiment of the present disclosure will be described below with reference to the accompanying drawings. In each drawing, the same components will be assigned the same reference codes and may in some cases not be described in a redundant manner.

First Embodiment

Figure 1:
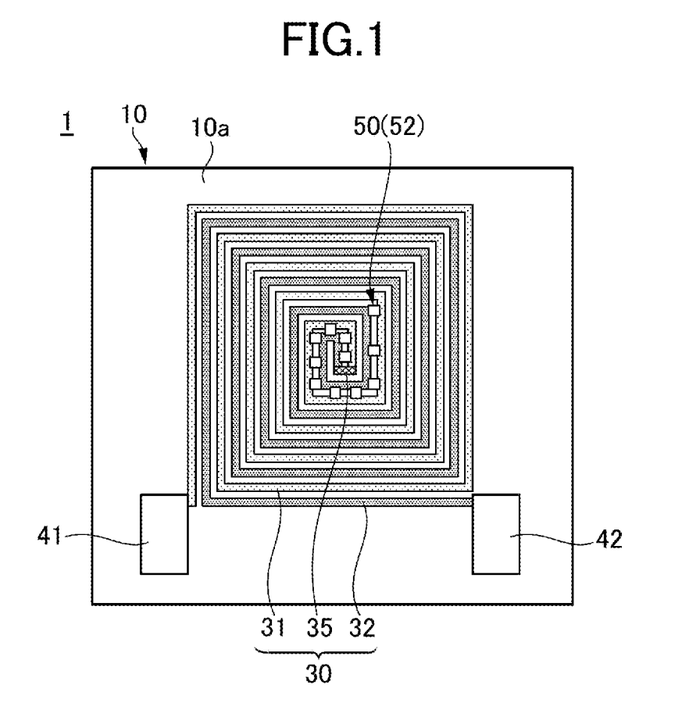
FIG. 1 is a plan view of an example of a strain gauge according to a first embodiment.
Figure 2:
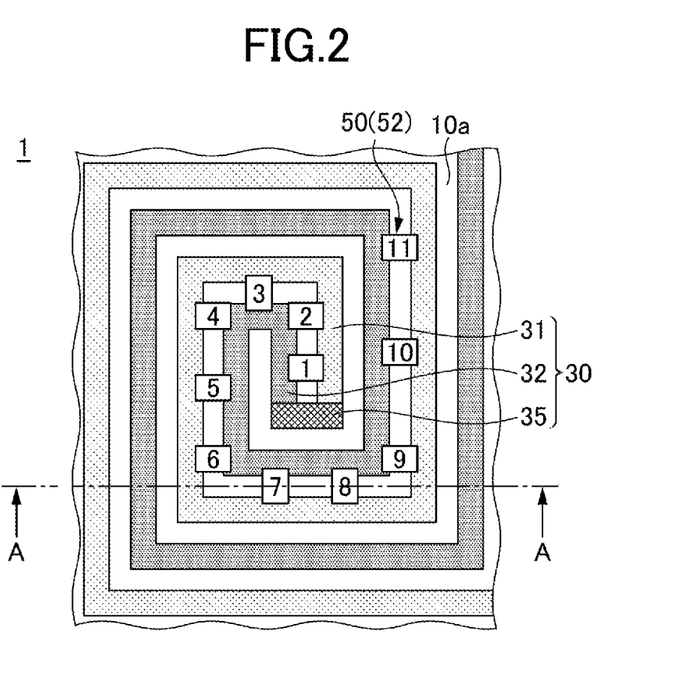
FIG. 2 is a partially enlarged plan view of the center part of FIG. 1.
Figure 3:
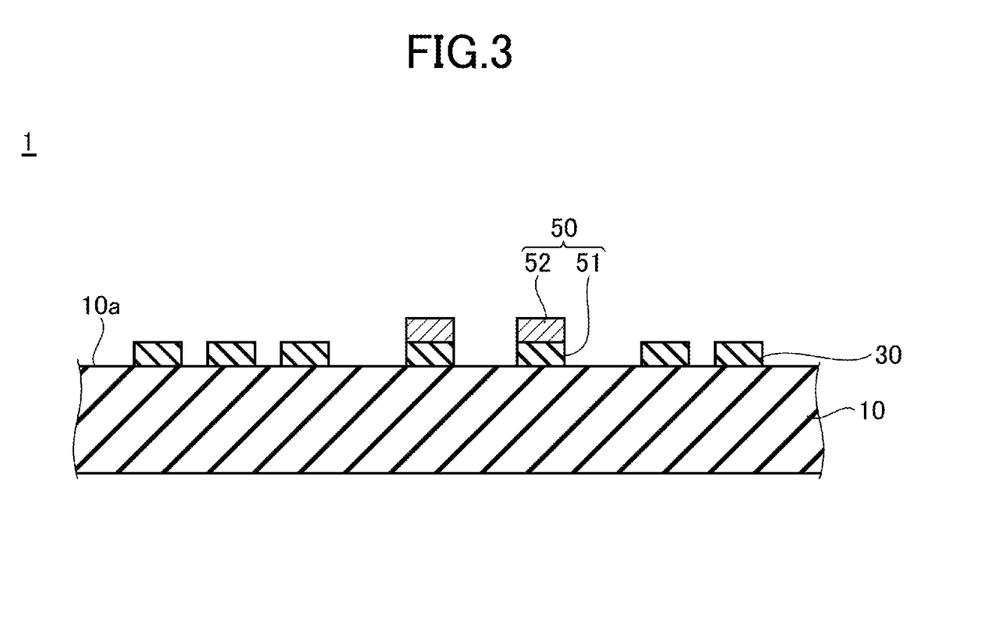
FIG. 3 is a cross-sectional view (example 1) that illustrates an example of the strain gauge according to the first embodiment.

FIG. 1 is a plan view that illustrates an example of a strain gauge according to a first embodiment. FIG. 2 is a partially enlarged plan view of the center part of FIG. 1. FIG. 3 is a cross-sectional view that illustrates an example of the strain gauge according to the first embodiment, and illustrates a cross section along line A-A in FIG. 2. Referring to FIG. 1 to FIG. 3, the strain gauge 1 has a substrate 10, a resistor 30, terminal parts 41 and 42, and resistance value tuning wires 50.

Note that, in the present embodiment, for ease of explanation, the side of the substrate 10 in the strain gauge 1 where the resistor 30 is provided will be referred to as the upper side or one side, and the side of the substrate 10 in the strain gauge 1 where the resistor 30 is not provided will be referred to as the lower side or the other side. Furthermore, in each component/part, the surface on the side where the resistor 30 is provided will be referred to as one surface or the upper surface, and the surface on the side where the resistor 30 is not provided will be referred to as the other surface or the lower surface. However, the strain gauge 1 can be used upside down, or can be disposed at any angle. Furthermore, plan view herein means that an object is viewed from a direction normal to an upper surface 10a of the substrate 10, and plan shape refers to the shape of an object as viewed from a direction normal to the upper surface 10a of the substrate 10.

The substrate 10 is a member that serves as a base layer for forming the resistor 30 and the like, and is flexible. The thickness of the substrate 10 is not particularly limited and can be selected in accordance with the purpose of use. For example, the substrate 10 may be approximately 5 μm to 500 μm thick. In particular, it is preferable if the substrate 10 is 5 μm to 200 μm thick because the transmission of strain from the surface of the strain generating body joined to the lower surface of the substrate 10 via a bonding layer or the like, the dimensional stability in the environment, and so forth are excellent then. It is even more preferable if the substrate is 10 μm thick or more because the insulation is excellent then.

The substrate 10 can be formed from an insulating resin film made of, for example, a polyimide (PI) resin, an epoxy resin, a polyether ether ketone (PEEK) resin, a polyethylene naphthalate (PEN) resin, a polyethylene terephthalate (PET) resin, a polyphenylene sulfide (PPS) resin, a polyolefin resin, and so forth. Note that a film herein refers to a flexible member that is approximately 500 µm thick or less.

Here, "the substrate 10 can be formed from an insulating resin film" by no means precludes the substrate 10 from containing fillers, impurities, and so forth in the insulating resin film. The substrate 10 may be formed from, for example, an insulating resin film that contains fillers such as silica or alumina.

Examples of materials of the substrate 10 other than resins include crystalline materials such as $SiO_2$, $ZrO_2$ (including YSZ), Si, $Si_2N_3$, $Al_2O_3$ (including sapphire), ZnO, perovskite ceramics ($CaTiO_3$, $BaTiO_3$, etc.) and so forth. Besides, additional examples include amorphous glass and the like. Furthermore, as materials of the substrate 10, metals such as aluminum, an aluminum alloy (duralumin), titanium, and others may be used. In this case, for example, an insulating film is formed on the substrate 10 made of metal.

The resistor 30 is a thin film formed on the substrate 10 in a predetermined pattern, and is a sensitive part that produces changes in resistance in response to strain. The resistor 30 may be formed directly on the upper surface 10a of the substrate 10, or may be formed on the upper surface 10a of the substrate 10 via other layers.

The resistor 30 is patterned in a spiral shape in plan view. The resistor 30 is one continuous pattern in which a terminal part 41 and a terminal part 42 are connected. Here, for ease of explanation, the part from the terminal part 41 to a halfway part 35 where the pattern turns around will be referred to as a first resistance wire 31, and the part from the halfway part 35 to the terminal part 42 will be referred to as a second resistance wire 32. Note that, in FIG. 1 and FIG. 2, for ease of explanation, the first resistance wire 31, the second resistance wire 32, and the halfway part 35 are shown in different satin patterns.

In the resistor 30, the first resistance wire 31 extends from the terminal part 41, and, patterned in a clockwise spiral shape that runs from the outer peripheral side towards the center, reaches the halfway part 35. The second resistance wire 32 extends from the halfway part 35, and, patterned in a counterclockwise spiral shape that runs from the center towards the outer peripheral side, reaches the terminal part 42.

The first resistance wire 31 and the second resistance wire 32 are arranged alternately in principle. That is, except in one part near the halfway part 35, the second resistance wire 32 is always next to the first resistance wire 31, and next to the first resistance wire 31 is always the second resistance wire 32. Except in one part near the halfway part 35, there are no neighboring first resistance wires 31 or neighboring second resistance wires 32.

As for the material of the resistor 30, for example, Cu—Ni (copper nickel), Ni—Cr (nickel chromium), constantan, a Cr composite film and the like can be used.

Here, the Cr composite film refers to a composite film of Cr, CrN, $Cr_2N$, and the like. The Cr composite film may contain incidental impurities such as chromium oxide.

The thickness of the resistor 30 is not particularly limited and can be selected in accordance with the purpose of use. The resistor 30 can be, for example, approximately 0.05 µm to 2 µm thick. In particular, it is preferable if the resistor 30 is 0.1 µm thick or more, because the crystallinity of crystals (e.g., the crystallinity of α-Cr) constituting the resistor 30 improves then. It is even more preferable if the resistor 30 is 1 µm thick or less, because the cracks in the film constituting the resistor 30 due to the film's internal stress and the warp from the substrate 10 can be reduced.

For example, if the resistor 30 is a Cr composite film, by using α-Cr (alpha-chromium), which has a stable crystalline phase, as the main component, the stability of gauge characteristics can be improved. Additionally, when the resistor 30 has α-Cr as its main component, the strain gauge 1 can have a gauge factor of 10 or higher, as well as a gauge factor temperature coefficient TCS and a resistance temperature coefficient TCR in the range of −1000 ppm/degrees Celsius to +1000 ppm/degrees Celsius. Here, "the main component" means that the substance of interest takes up 50% or more by weight of all the substances constituting the resistor. It is preferable if the resistor 30 contains 80% or more of α-Cr by weight, and more preferable if the resistor 30 contains 90% or more of α-Cr by weight, from the viewpoint of improving the gauge characteristics. Note that α-Cr is a Cr having a bcc structure (body-centered cubic structure).

Also, when the resistor 30 is a Cr composite film, the CrN and $Cr_2N$ contained in the Cr composite film are preferably 20% or less by weight. When the CrN and $Cr_2N$ contained in the Cr composite film are 20% or less by weight, the decrease in the gauge ratio can be reduced.

Furthermore, the proportion of $Cr_2N$ in CrN and $Cr_2N$ is preferably 80% or more by weight and less than 90% by weight, and, more preferably, 90% or more by weight and less than 95% by weight. When the proportion of $Cr_2N$ in CrN and $Cr_2N$ is 90% or more by weight and less than 95% by weight, $Cr_2N$, having semiconductor-like properties, makes the decrease of TCR (negative TCR) more noticeable. Furthermore, reduced use of ceramic materials enables the reduction of brittle fracture as well.

Meanwhile, when a small amount of $N_2$ or atomic N gets mixed or is present in the film, the external environment (e.g., high temperature environment) might make them escape from the film, and this might result in a change in the film stress. By creating a chemically stable CrN, a stable strain gauge can be obtained without generating the above unstable N.

The terminal parts 41 and 42 are a pair of terminal parts that are electrically connected to both ends of the resistor 30. The terminal part 41 extends from one end part of the resistor 30. In plan view, the terminal part 41 is wider than the resistor 30 and is formed in a substantially rectangular shape. The terminal part 42 extends from the other end part of the resistor 30. In plan view, the terminal part 42 is wider than the resistor 30 and is formed in a substantially rectangular shape. The terminal parts 41 and 42 are a pair of electrodes for outputting the strain-induced changes of the resistance value of the resistor 30 to the outside, and, for example, lead wires for external connection are joined. The upper surfaces of the terminal parts 41 and 42 may be coated with a metal having better solderability than the terminal parts 41 and 42.

The resistance value tuning wires 50 are wires provided to adjust the resistance value between the terminal part 41 and the terminal part 42. A number of resistance value tuning wires 50 are provided so as to short-circuit the adjacent first resistance wire 31 and the second resistance wire 32. Although 11 resistance value tuning wires 50 are provided as an example in this embodiment, the number of resistance value tuning wires 50 can be set freely by taking into account the range in which the resistance needs to be adjusted. In addition, in FIG. 2, for ease of explanation, 11 resistance value tuning wires 50 are shown with the numerical values 1 to 11 assigned from the part closest to the halfway part 35.

The 11 resistance value tuning wires 50 include resistance value tuning wires that bridge between the first resistance wire 31 and the second resistance wire 32 in different directions. For example, assuming that the plan shape of the substrate 10 in FIG. 1 is rectangular, there are resistance value tuning wires 50 (Nos. 1, 2, 4 to 6, and 9 to 11) that bridge between the first resistance wire 31 and the second resistance wire 32 in a direction parallel to the laterally extending sides of the substrate 10 in FIG. 1, and resistance value tuning wires 50 (Nos. 3, 7, and 8) that bridge between the first resistance wire 31 and the second resistance wire 32 in the vertical direction.

Although, in conventional comb-shaped strain gauges, the resistance value tuning wires are formed only in one direction, in this strain gauge 1, the resistor 30 has an isotropic pattern, so that the resistance value tuning wires 50 can also be arranged isotopically. Even such an arrangement does not affect the accuracy of detection of the strain gauge 1.

By disconnecting any of the resistance value tuning wires 50 among the 11 resistance value tuning wires 50 with a laser or the like, the resistance value between the terminal part 41 and the terminal part 42 can be increased. Disconnecting all of the 11 resistance value tuning wires 50 makes the resistance value between the terminal part 41 and the terminal part 42 the highest.

Given a circle drawn in plan view about the center of gravity of the region where the resistor 30 is formed, it is preferable if all of the resistance value tuning wires 50 are arranged such that the area of the circle is kept within 30% of the area of the resistor-forming region. By arranging all the resistance value tuning wires 50 in this range, the occurrence of sensitivity anisotropy can be confined within an allowable range.

Given a circle drawn about the center of gravity of the region where the resistor 30 is formed, it is more preferable if all of the resistance value tuning wires 50 are arranged such that the area of the circle is kept within 20% of the area of the resistor-forming region. By arranging all the resistance value tuning wires 50 in this range, the occurrence of sensitivity anisotropy can be further reduced.

Note that, in plan view, the resistor forming region is the sum of the region in which the resistor 30 is formed and the regions between the neighboring first resistance wire 31 and second resistance wire 32. Also, in plan view, the area of the resistor forming region is the sum of the area of the resistor 30 and the area of the regions between the neighboring first resistance wire 31 and second resistance wire 32.

The distance between neighboring resistance value tuning wires 50 is preferably 30 μm or more, considering the accuracy of machining. Furthermore, it is preferable if the resistance value tuning wires 50 are distanced evenly, because it makes the adjustment of resistance easy.

The resistance value tuning wires 50 have a structure in which a second layer 52 is laminated on top of a first layer 51. The first layer 51 is made of the same material as the resistor 30 and the terminal parts 41 and 42. The first layer 51 has the same thickness as the resistor 30 and the terminal parts 41 and 42. That is, although the resistor 30, the terminal parts 41 and 42, and the first layer 51 are shown with different reference numerals for ease of explanation, they can be formed using the same material, and can be formed integrally, through the same process.

The second layer 52 is a metal layer formed from a material having a lower gauge ratio than the resistor 30. The second layer 52 may be formed only on top of the first layer 51, or stick out of the first layer 51 onto the first resistance wire 31 and/or the second resistance wire 32.

The material of the second layer 52 is not particularly limited as long as it has a lower gauge ratio than the resistor 30, and can be selected in accordance with the purpose of use. For example, when the resistor 30 is a Cr composite film, Cu, Ni, Al, Ag, Au, Pt, and so forth, an alloy of some of these metals, a compound of some of these metals, or a laminated film in which these metals, alloy and compound are layered as appropriate, can be used as the material of the second layer 52. The thickness of the second layer 52 is not particularly limited and can be selected in accordance with the purpose of use, and may be, for example, approximately 0.01 μm to 30 μm. Note that, when a metal layer is formed on the upper surfaces of the terminal parts 41 and 42, the same material as the second layer 52 may be used, and the metal layer may be formed integrally, through the same process.

After the resistance value between the terminal part 41 and the terminal part 42 is adjusted by disconnecting the resistance value tuning wires 50 as appropriate, if necessary, a cover layer (insulating resin layer) may be provided on the upper surface 10a of the substrate 10 so as to cover the resistor 30 and the resistance value tuning wires 50 and expose the terminal part 41 and the terminal part 42. By providing the cover layer, the resistor 30 and the resistance value tuning wires 50 can be prevented from, for example, getting mechanically damaged. Furthermore, by providing the cover layer, the resistor 30 and the resistance value tuning wires 50 can be protected from moisture and the like. Note that the cover layer may be provided so as to cover all parts except for the terminal parts 41 and 42.

The cover layer can be formed from an insulating resin such as a PI resin, an epoxy resin, a PEEK resin, a PEN resin, a PET resin, a PPS resin, or a composite resin (e.g., a silicone resin or a polyolefin resin). The cover layer may contain fillers or pigments. The thickness of the cover layer is not particularly limited and can be selected in accordance with the purpose of use, and may be, for example, approximately 2 μm to 30 μm.

To manufacture the strain gauge 1, first, the substrate 10 is prepared, the first metal layer is formed on the upper surface 10a of the substrate 10, and, furthermore, the second metal layer is formed on top of the first metal layer.

The first metal layer is the layer that is patterned in the end and serves as the resistor 30, the terminal parts 41 and 42, and the first layer 51. Therefore, the material and thickness of the first metal layer are the same as the material and thickness of the above-described resistor 30, terminal parts 41 and 42, and first layer 51. The second metal layer is the layer that is patterned in the end and serves as the second layer 52 of the resistance value tuning wires 50. Therefore, the material and thickness of the second metal layer are the same as the material and thickness of the above-described second layer 52.

The first layer 30 can be formed, for example, by magnetron sputtering, which targets a raw material that can form the resistor 30. Instead of magnetron sputtering, reactive sputtering, vapor deposition, arc ion plating, pulsed laser deposition, and so forth may be used to form the first metal layer.

From the viewpoint of gaining stable gauge characteristics, it is preferable if, before the first metal layer is formed, a functional layer having a film thickness of approximately 1 nm to 100 nm is vacuum-formed on the upper surface 10a of the substrate 10, as a foundation layer, by conventional sputtering, for example.

In the present application, the functional layer refers to a layer that at least has a function of facilitating the crystal growth of the first metal layer (the resistor 30), which is an upper layer. It is preferable if the functional layer additionally has a function of preventing oxidation of the resistor 30 due to the oxygen or moisture contained in the substrate 10, and a function of improving the adhesion between the substrate 10 and the first metal layer. The functional layer may additionally have other functions as well.

The insulating resin film that constitutes the substrate 10 contains oxygen and moisture. In particular, when the resistor 30 contains Cr, it is effective for the functional layer to have a function of preventing oxidation of the resistor 30, because Cr forms a self-autoxidized film.

The material of the functional layer is not particularly limited as long as it at least has a function of facilitating the crystal growth of the resistor 30, which is an upper layer, and can be selected in accordance with the purpose of use. The material may be, for example, one or more types of metals selected from the group consisting of Cr (chromium), Ti (titanium), V (vanadium), Nb (niobium), Ta (tantalum), Ni (nickel), Y (yttrium), Zr (zirconium), Hf (hafnium), Si (silicon), C (carbon), Zn (zinc), Cu (copper), Bi (bismuth), Fe (iron), Mo (molybdenum), W (tungsten), Ru (ruthenium), Rh (rhodium), Re (rhenium), Os (osmium), Ir (iridium), Pt (platinum), Pd (palladium), Ag (silver), Au (gold), Co (cobalt), Mn (manganese), and Al (aluminum), an alloy of some of the metals in this group, or a compound of some of the metals in this group.

Examples of the above alloy include FeCr, TiAl, FeNi, NiCr, CrCu, and the like. Examples of the above compound include TiN, TaN, $Si_3N_4$, $TiO_2$, $Ta_2O_5$, $SiO_2$, and the like.

When the functional layer is formed from a conductive material such as a metal or an alloy, the film thickness of the functional layer is preferably 1/20 or less of the film thickness of the resistor. When the film thickness of the functional layer is in this range, it is possible to facilitate the crystal growth of α-Cr, and prevent a situation where part of the current flowing in the resistor flows into the functional layer and causes a decrease in the sensitivity of strain detection.

When the functional layer is formed from a conductive material such as a metal or an alloy, the film thickness of the functional layer is more preferably 1/50 or less of the film thickness of the resistor. When the film thickness of the functional layer is in this range, it is possible to facilitate the crystal growth of α-Cr, and prevent, more effectively, a situation where part of the current flowing in the resistor flows into the functional layer and causes a decrease in the sensitivity of strain detection.

When the functional layer is formed from a conductive material such as a metal or an alloy, the film thickness of the functional layer is even more preferably 1/100 or less of the film thickness of the resistor. When the film thickness of the functional layer is in this range, it is possible to prevent, even more effectively, a situation where part of the current flowing in the resistor flows into the functional layer and causes a decrease in the sensitivity of strain detection.

When the functional layer is formed from an insulating material such as an oxide or a nitride, the film thickness of the functional layer is preferably 1 nm to 1 μm. When the film thickness of the functional layer is in this range, it is possible to facilitate the crystal growth of α-Cr, and form a film easily without forming cracks in the functional layer.

When the functional layer is formed from an insulating material such as an oxide or a nitride, the film thickness of the functional layer is more preferably 1 nm to 0.8 μm. When the film thickness of the functional layer is in this range, it is possible to facilitate the crystal growth of α-Cr, and form a film even more easily without forming cracks in the functional layer.

When the functional layer is formed from an insulating material such as an oxide or a nitride, the film thickness of the functional layer is even more preferably 1 nm to 0.5 μm. When the film thickness of the functional layer is in this range, it is possible to facilitate the crystal growth of α-Cr, and form a film even more easily without forming cracks in the functional layer.

Note that the plan shape of the functional layer is patterned substantially the same as the plan shape of the resistor illustrated in FIG. 1, for example. However, the plan shape of the functional layer does not necessarily have to be substantially the same as the plan shape of the resistor. When the functional layer is formed from an insulating material, it does not have to be patterned in the same shape as the plan shape of the resistor. In this case, the functional layer may be formed solidly at least in the region where the resistor is formed. Alternatively, the functional layer may be formed solidly over the entire upper surface of the substrate 10.

Also, when the functional layer is formed from an insulating material, the functional layer may be made relatively thick, such as 50 nm thick or more and 1 μm thick or less, and formed in a solid shape, so that the thickness and the surface area of the functional layer is increased, and the heat that is generated when the resistor warms up can be readily dissipated to the substrate 10 side. As a result of this, in the strain gauge 1, it is possible to reduce the decrease of the accuracy of measurement due to the resistor's self-heating.

The functional layer can be vacuum-formed by, for example, conventional sputtering, which targets a raw material that can form the functional layer and introduces an Ar (argon) gas into a chamber. By using conventional sputtering, the functional layer is formed while the upper surface 10a of the substrate 10 is being etched with Ar, and therefore it is possible to form the functional layer only in a minimal amount, and achieve an effect of improved adhesion.

However, this is simply one example of the method of forming the functional layer, and the functional layer may be formed by other methods as well. For example, a method may be used here in which: before the functional layer is formed, the upper surface 10a of the substrate 10 is activated by plasma treatment using Ar or the like, so as to gain an adhesion improving effect; and subsequently, the functional layer is vacuum-formed by magnetron sputtering.

The combination of the material of the functional layer and the material of the first metal layer is not particularly limited and can be selected in accordance with the purpose of use. For example, it is possible to form a Cr composite film by using Ti as the main component of the functional layer and α-Cr (alpha-chromium) as the main component of the first metal layer.

In this case, the first metal layer can be formed by magnetron sputtering, which targets a raw material that can form the functional layer and introduces an Ar gas into a chamber. Alternatively, reactive sputtering, which targets pure Cr and introduces an appropriate amount of nitrogen gas into a chamber with an Ar gas, may be used to form the first metal layer. In this case, by changing the amount and pressure (nitrogen partial pressure) of nitrogen gas to be introduced, adjusting the heating temperature by providing a heating step, and so forth, it is possible to adjust the proportions of CrN and $Cr_2N$ contained in the Cr composite film, as well as the proportion of $Cr_2N$ in CrN and $Cr_2N$.

In such methods, the growth surface of the Cr composite film is defined based on the functional layer consisting of Ti, and a Cr composite film can be formed by using α-Cr, which has a stable crystalline structure, as the main component. Also, Ti that constitutes the functional layer is diffused in the Cr composite film, so that improved gauge characteristics are gained. For example, the gauge factor of the strain gauge 1 can be made 10 or more, and the gauge factor temperature coefficient TCS and the resistance temperature coefficient TCR can be kept in the range of −1000 ppm/degrees Celsius to +1000 ppm/degrees Celsius. Note that, when the functional layer is formed from Ti, the Cr composite film might contain Ti or TiN (titanium nitride).

Note that, when the first metal layer is a Cr composite film, the functional layer consisting of Ti has all of the function of facilitating the crystal growth of the first metal layer, the function of preventing oxidation of the first metal layer due to the oxygen or moisture contained in the substrate 10, and the function of improving the adhesion between the substrate 10 and the first metal layer. The same applies when Ta, Si, Al, or Fe is used for the functional layer, instead of Ti.

In this way, by providing a functional layer in a lower layer of the first metal layer, it becomes possible to facilitate the crystal growth of the first metal layer, and fabricate a first metal layer consisting of a stable crystalline phase. As a result of this, the stability of gauge characteristics in the strain gauge 1 can be improved. Furthermore, since the material to constitute the functional layer is diffused in the first metal layer, the gauge characteristics of the strain gauge 1 can be improved.

The second metal layer can be formed by, for example, magnetron sputtering, which targets a raw material that can form the second metal layer. The second metal layer may be formed by reactive sputtering, vapor deposition, plating, arc ion plating, a pulse laser deposition, and the like, instead of magnetron sputtering. When forming the second metal layer thick, it is preferable to choose plating.

Next, the second metal layer is patterned by photolithography, and the planar second layer 52 illustrated in FIG. 1 is formed. Next, the first metal layer is patterned by photolithography, and the planar resistor 30, terminal parts 41 and 42, and first layer 51 illustrated in FIG. 1 are formed. By 1C this means, the second layer 52 is laminated on top of the first layer 51, and the resistance value tuning wires 50 are formed.

Figure 4:
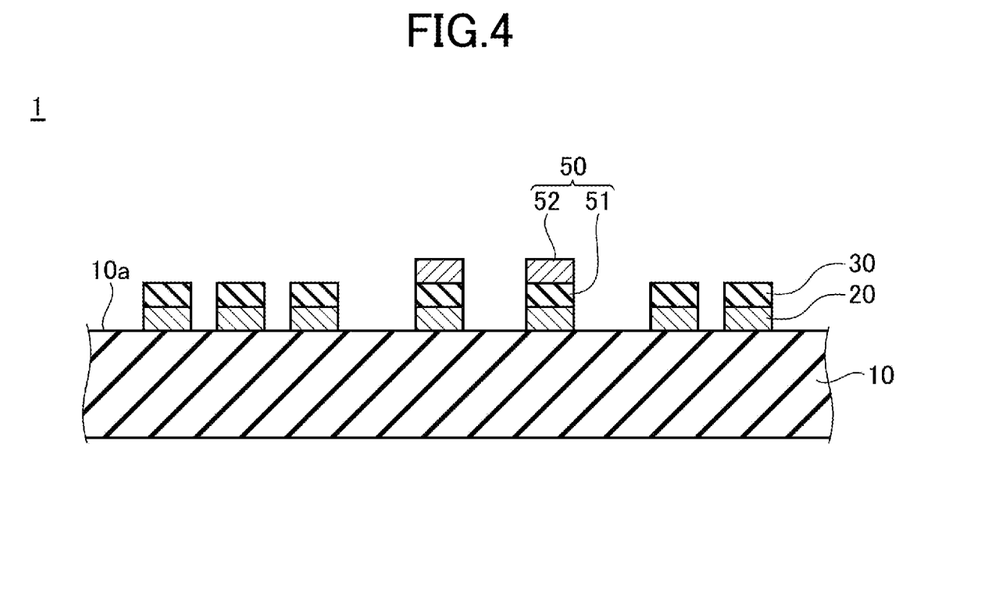
FIG. 4 is a cross-sectional view (example 2) that illustrates an example of the strain gauge according to the first embodiment.

When a functional layer is provided on the upper surface 10a of the substrate 10 as a foundation layer for the resistor 30, the terminal parts 41 and 42, and the first layer 51, the strain gauge 1 has the cross-sectional shape illustrated in FIG. 4. The layer indicated by the reference numeral 20 is the functional layer. The plan shape of the strain gauge 1 when the functional layer 20 is provided is the same as that in FIG. 1.

Figure 5:
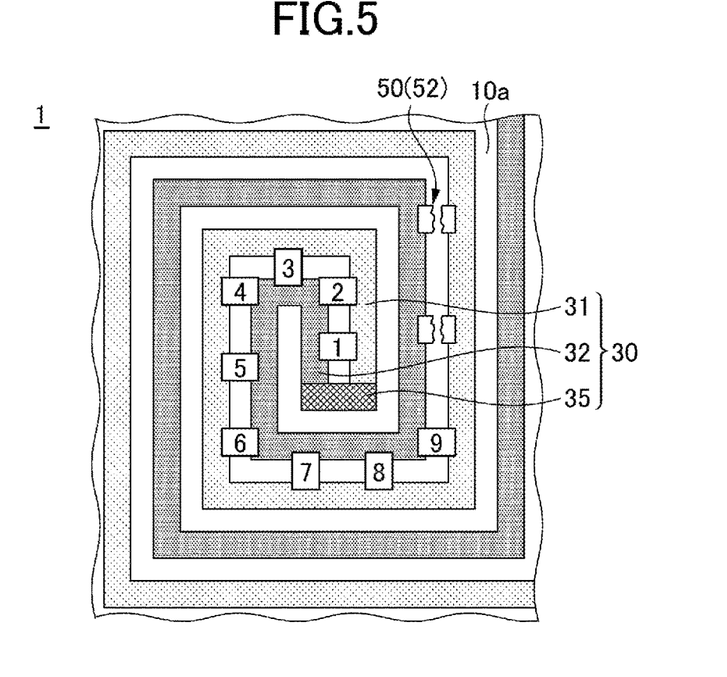
FIG. 5 is a diagram (example 1) that illustrates an example of disconnecting the resistance value tuning wires.
Figure 6:
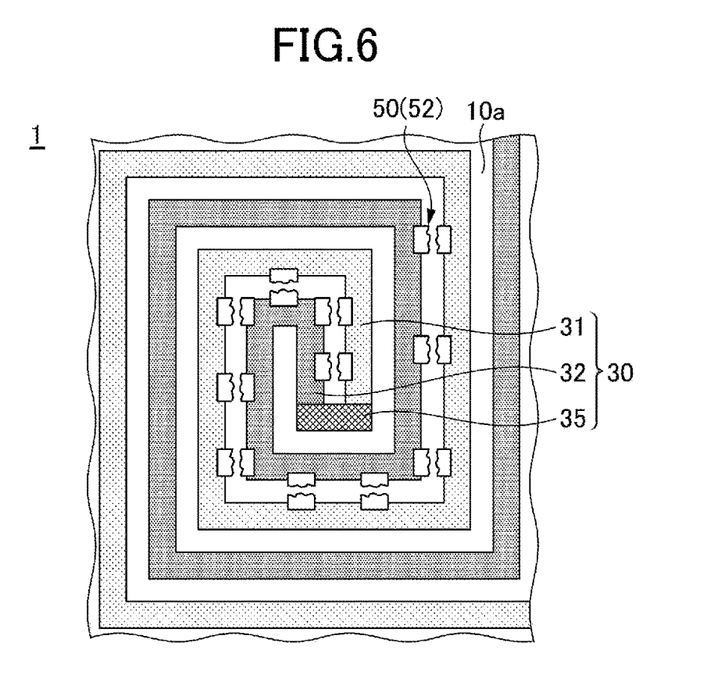
FIG. 6 is a diagram (example 2) that illustrates an example of disconnecting the resistance value tuning wires.

Following this, the resistance value between the terminal part 41 and the terminal part 42 is adjusted by disconnecting the resistance value tuning wires 50 as appropriate. For example, as illustrated in FIG. 5 and FIG. 6, a part or all of the resistance value tuning wires 50 are disconnected. FIG. 5 illustrates an example in which, among Nos. 1 to 11 of the resistance value tuning wires 50 illustrated in FIG. 2, Nos. 10 and 11 are disconnected. Furthermore, FIG. 6 illustrates an example in which Nos. 1 to 11 of the resistance value tuning wires 50 illustrated in FIG. 2 are all disconnected. In this way, the strain gauge 1 is shipped, as a product, in a state in which a part or all of the resistance value tuning wires 50 are disconnected. However, the strain gauge 1 might in some cases be shipped in a state in which none of the resistance value tuning wires 50 is disconnected.

Note that, in the present application, the resistance value tuning wires 50 may be either yet to be disconnected (the state illustrated in FIG. 2) or already disconnected (the states illustrated in FIG. 5 and FIG. 6). That is, in any of FIG. 2, FIG. 5, and FIG. 6, the strain gauge 1 has resistance value tuning wires 50.

Next, if necessary, a cover layer that covers the resistor 30 and the resistance value tuning wires 50 and that exposes the terminal parts 41 and 42 is provided on the upper surface 10a of the substrate 10. Upon providing this cover layer, the strain gauge 1 is completed. For example, the cover layer can be fabricated by laminating a thermosetting insulating resin film in a semi-cured state on the upper surface 10a of the substrate 10, such that the resistor 30 and the resistance value tuning wires 50 are covered by the resin film and the terminal parts 41 and 42 are exposed, and then heating and curing this laminated film. The cover layer may be fabricated by applying a liquid or paste-like thermosetting insulating resin to the upper surface 10a of the substrate 10, such that the resistor 30 and the resistance value tuning wires 50 are coated with the insulating resin and the terminal parts 41 and 42 are exposed, and then heating and curing this applied resin.

As described above, in the strain gauge 1, the resistor 30 is formed as a spiral isotropic pattern approximately about the halfway part 35. This makes it possible to prevent an occurrence of vertical and horizontal sensitivity anisotropies, such as that which occur with comb-shaped strain gauges.

Furthermore, since the strain gauge 1 includes resistance value tuning wires 50, it is possible to fine-tune the resistance value between the terminal part 41 and the terminal part 42. By this means, the productivity (yield) of the strain gauge 1 can be improved.

Modification 1 of the First Embodiment

A modification 1 of the first embodiment shows an example of a strain gauge having a layer structure that is different from the first embodiment. Note that, in modification 1 of the first embodiment, the description of components that are the same as those of the embodiment and that have been described above might be omitted.

Figure 7:
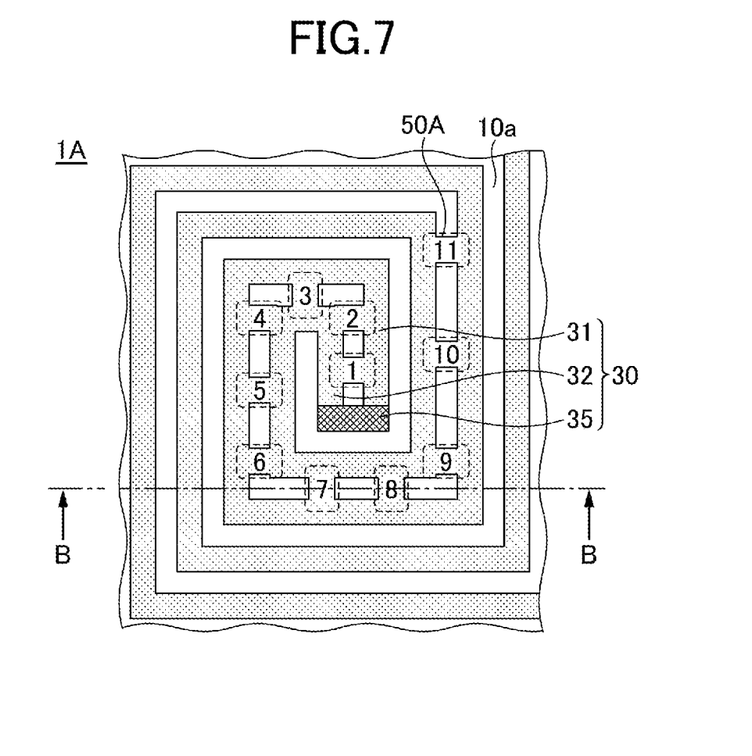
FIG. 7 is a partially enlarged plan view that illustrates a strain gauge according to a modification 1 of the first embodiment.
Figure 8:
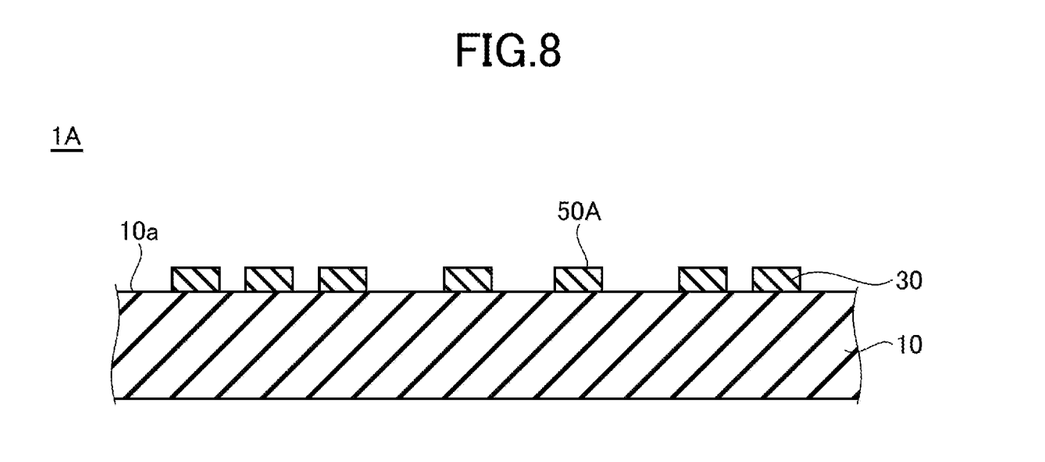
FIG. 8 is a cross-sectional view that illustrates an example of the strain gauge according to modification 1 of the first embodiment.

FIG. 7 is a partially enlarged plan view that illustrates a strain gauge according to modification 1 of the first embodiment. FIG. 8 is a cross-sectional view that illustrates an example of the strain gauge according to modification 1 of the first embodiment, and illustrates a cross section along line B-B of FIG. 7. In the strain gauge according to modification 1 of the first embodiment, parts other than those illustrated in FIG. 7 have the same plan shape as in FIG. 1.

Referring to FIG. 7 and FIG. 8, a strain gauge 1A is different from the strain gauge 1 (see FIG. 1 to FIG. 3, etc.) in that the resistance value tuning wires 50 are replaced with resistance value tuning wires 50A. The resistance value tuning wires 50A are formed only with the first layer 51 of the resistance value tuning wires 50, and no second layer 52 is laminated thereon. The resistance value tuning wires 50A can be formed of the same material as the resistor 30 and the terminal parts 41 and 42, integrally, through the same process.

In this way, the resistance value tuning wires 50A may have a one-layer structure using the same materials as the resistor 30 and the terminal parts 41 and 42. Since it is not necessary to form the second layer 52 unlike the strain gauge 1, the manufacturing process of the strain gauge 1A can be simplified compared to the strain gauge 1.

However, since the resistance value tuning wires 50A of the strain gauge 1A have higher resistance values than the resistance value tuning wires 50 of the strain gauge 1, the voltage drop is greater when the same current flows. Since this causes detection errors of the strain gauge 1A, it is necessary to select whether to use the resistance value tuning wires 50 or use the resistance value tuning wires 50A based on the specifications required for the product.

Modification 2 of the First Embodiment

A modification 2 of the first embodiment shows an example of a strain gauge having a plan shape that is different from the first embodiment. Note that, in modification 2 of the first embodiment, the description of components that are the same as those of the embodiment and that have been described above might be omitted.

Figure 9:
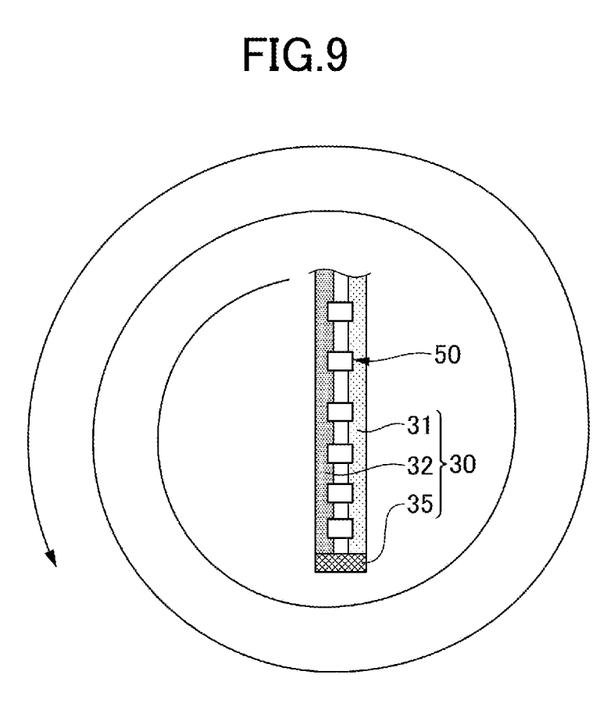
FIG. 9 is a diagram, in which a spiral resistor is straightened virtually.

In FIG. 9, the spiral resistor 30 of the strain gauge 1 illustrated in FIG. 2 is straightened virtually. FIG. 9 shows two linear resistance wires, namely the first resistance wire 31 and the second resistance wire 32 that are a predetermined space apart from each other and that extend from the halfway part 35 in the same direction, and a plurality of resistance value tuning wires 50 that are arranged discretely so as to bridge between the first resistance wire 31 and the second resistance wire 32.

In the present application, the term "spiral" refers to the shape in which the first resistance wire 31 and the second resistance wire 32 illustrated in FIG. 9 are formed spirally in the arrow direction or the counter arrow direction with the halfway part 35 at the center. As long as this shape is given, the overall shape of the resistor 30 does not matter.

Figure 10:
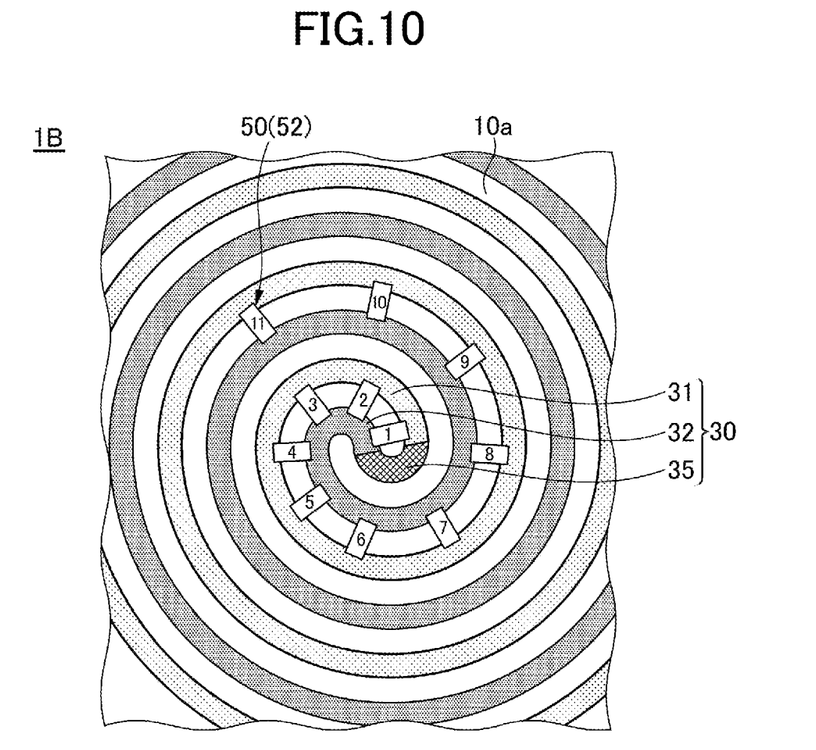
FIG. 10 is a plan view that illustrates an example of a strain gauge according to a modification 2 of the first embodiment.

For example, when the first resistance wire 31 and the second resistance wire 32 illustrated in FIG. 9 are wound substantially squarely about the halfway part 35, a substantially square spiral shape like that of the spiral gauge 1 illustrated in FIG. 2 is given. Furthermore, when the first resistance wire 31 and the second resistance wire 32 illustrated in FIG. 9 are wound substantially circularly about the halfway part 35, a substantially circular spiral shape like that of the strain gauge 1B illustrated in FIG. 10 is given.

Note that, when the first resistance wire 31 and the second resistance wire 32 illustrated in FIG. 9 are wound substantially circularly about the halfway part 35, this is advantageous in terms of anisotropy, compared to the case in which the first resistance wire 31 and the second resistance wire 32 are wound substantially squarely. On the other hand, when the first resistance wire 31 and the second resistance wire 32 are wound substantially squarely, although anisotropy is more likely to occur between the vertical and horizontal lines, a square strain field has an advantage that the sensitive parts are provided in the densest arrangement.

The spiral strain gauge according to the present embodiment is not limited to being a substantially square spiral or a substantially circular spiral, and may be formed in a substantially rectangular shape, a substantially elliptical shape, or other, more complicated shapes (e.g., a star shape). In short, the first resistance wire 31 and the second resistance wire 32 have only to be formed as a spiral isotropic pattern about the halfway part 35. This makes it possible to prevent an occurrence of vertical and horizontal sensitivity anisotropies such as that which occurs with comb-shaped strain gauges.

Although a preferred embodiment and other forms of the present disclosure have been described above in detail as examples, the present disclosure is by no means limited to these examples, and a variety of modifications and replacements can be introduced to the above examples without departing from the scope set forth in the claims.

This international application claims priority to Japanese Patent Application No. 2020-004564, filed Jan. 15, 2020, the entire contents of which are incorporated herein by reference.

REFERENCE SIGNS LIST

1, 1A, 1B Strain gauge
10 Substrate
10a Upper surface
20 Functional layer
30 Resistor
31 First resistance wire
32 Second resistance wire
35 Halfway part
41, 42 Terminal part
50, 50A Resistance value tuning wire
51 First layer
52 Second layer

The invention claimed is:

1. A strain gauge comprising:
a flexible substrate;
a resistor formed on one side of the substrate;
a pair of terminal parts electrically connected to both ends of the resistor; and
a plurality of resistance value tuning wires configured to tune a resistance value between the pair of terminal parts,
wherein a plan shape of the resistor is a spiral shape formed by two linear resistance wires about a halfway part of the two linear resistance wires, the two linear resistance wires being a predetermined space apart from each other and extending in a same direction from the halfway part,
wherein the resistance value tuning wires are arranged discretely so as to bridge between the two linear resistance wires, and
wherein, given a circle drawn in plan view about a center of gravity of a region where the resistor is formed, all the resistance value tuning wires are arranged in a region where an area of the circle is within 30% of an area of the region where the resistor is formed.

2. The strain gauge according to claim 1, wherein the plurality of resistance value tuning wires include resistance value tuning wires that bridge between the two resistance wires in different directions.

3. The strain gauge according to claim 1, wherein the plurality of resistance value tuning wires include a disconnected resistance value tuning wire.

4. The strain gauge according to claim 1,
wherein a functional layer formed from a metal, an alloy, or a compound of metals is provided on a substrate side of the resistor, and
wherein the functional layer has a function of facilitating crystal growth of the α-Cr and forming a film containing the α-Cr as a main component.

5. A strain gauge comprising:
a flexible substrate;
a resistor formed on one side of the substrate;
a pair of terminal parts electrically connected to both ends of the resistor; and
a plurality of resistance value tuning wires configured to tune a resistance value between the pair of terminal parts,
wherein a plan shape of the resistor is a spiral shape formed by two linear resistance wires about a halfway part of the two linear resistance wires, the two linear resistance wires being a predetermined space apart from each other and extending in a same direction from the halfway part, wherein the resistance value tuning wires are arranged discretely so as to bridge between the two linear resistance wires, and wherein each resistance value tuning wire includes:

a first layer that is formed from a same material as the resistor and the pair of terminal parts; and a second layer that is laminated on top of the first layer and that is formed from a material having a lower gauge ratio than the resistor.

6. A strain gauge comprising:

a flexible substrate;

a resistor formed on one side of the substrate;

a pair of terminal parts electrically connected to both ends of the resistor; and a plurality of resistance value tuning wires configured to tune a resistance value between the pair of terminal parts, wherein a plan shape of the resistor is a spiral shape formed by two linear resistance wires about a halfway part of the two linear resistance wires, the two linear resistance wires being a predetermined space apart from each other and extending in a same direction from the halfway part, wherein the resistance value tuning wires are arranged discretely so as to bridge between the two linear resistance wires, and wherein the resistor is formed from a film containing Cr, CrN, and $Cr_2N$ and containing α-Cr as a main component.

7. The strain gauge according to claim 6, wherein the resistor contains 20% or less by weight of CrN and $Cr_2N$.

8. The strain gauge according to claim 7, wherein a proportion of $Cr_2N$ in CrN and $Cr_2N$ is 80% or more by weight and less than 90% by weight.

* * * * *